United States Patent
Harada

[11] Patent Number: 6,141,049
[45] Date of Patent: *Oct. 31, 2000

[54] IMAGE GENERATING DEVICE HAVING ADJUSTABLE SENSITIVITY

[75] Inventor: Kouichi Harada, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/780,536

[22] Filed: Jan. 8, 1997

[30] Foreign Application Priority Data

Jan. 9, 1996 [JP] Japan ................................. 8-001413

[51] Int. Cl.[7] ................................................ H04N 5/228
[52] U.S. Cl. ............................................................ 348/296
[58] Field of Search ..................................... 348/296, 311, 348/297, 320, 305–309; 257/242, 232, 230

[56] References Cited

U.S. PATENT DOCUMENTS

| 4,455,575 | 6/1984 | Murakoshi | 348/322 |
|---|---|---|---|
| 4,521,797 | 6/1985 | Oda | 257/222 |
| 4,769,709 | 9/1988 | Van De Steeg | 348/296 |
| 4,805,026 | 2/1989 | Oda | 348/320 |
| 4,935,794 | 6/1990 | Miyatake | 257/232 |
| 4,959,724 | 9/1990 | Ueda | 348/320 |
| 5,027,218 | 6/1991 | Ueda | 348/319 |
| 5,194,957 | 3/1993 | Kyuma | 348/296 |
| 5,287,192 | 2/1994 | Iizuka | 348/311 |
| 5,438,365 | 8/1995 | Yamashita et al. | 348/297 |
| 5,463,421 | 10/1995 | Deguchi et al. | 348/296 |
| 5,488,416 | 1/1996 | Kyuma | 348/296 |
| 5,663,763 | 9/1997 | Fukui | 348/323 |

*Primary Examiner*—Tuan Ho
*Assistant Examiner*—Aung S. Moe
*Attorney, Agent, or Firm*—Hill & Simpson

[57] ABSTRACT

A solid-state imaging apparatus in which the dynamic range can be increased and its magnification factor can be made variable without lowering the sensitivity. A plurality of photosensors are formed on the obverse surface of a semiconductor substrate. A vertical register and a read-out channel are disposed at one side of each of the photosensors. A read-out electrode of the read-out channel and a transfer electrode of the vertical register are formed of different conductive layers. A reading method used in the solid-state imaging apparatus is also included.

12 Claims, 6 Drawing Sheets

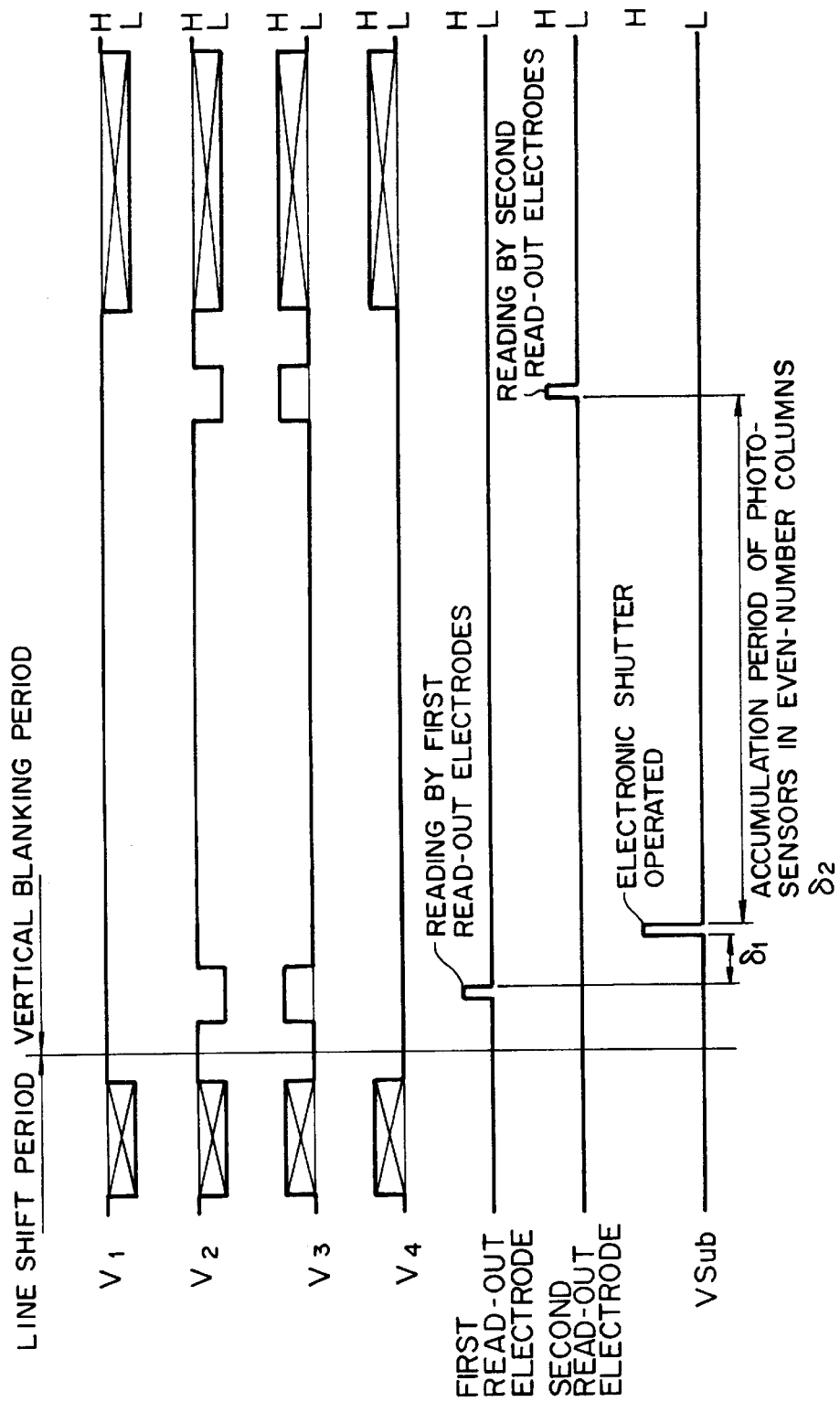

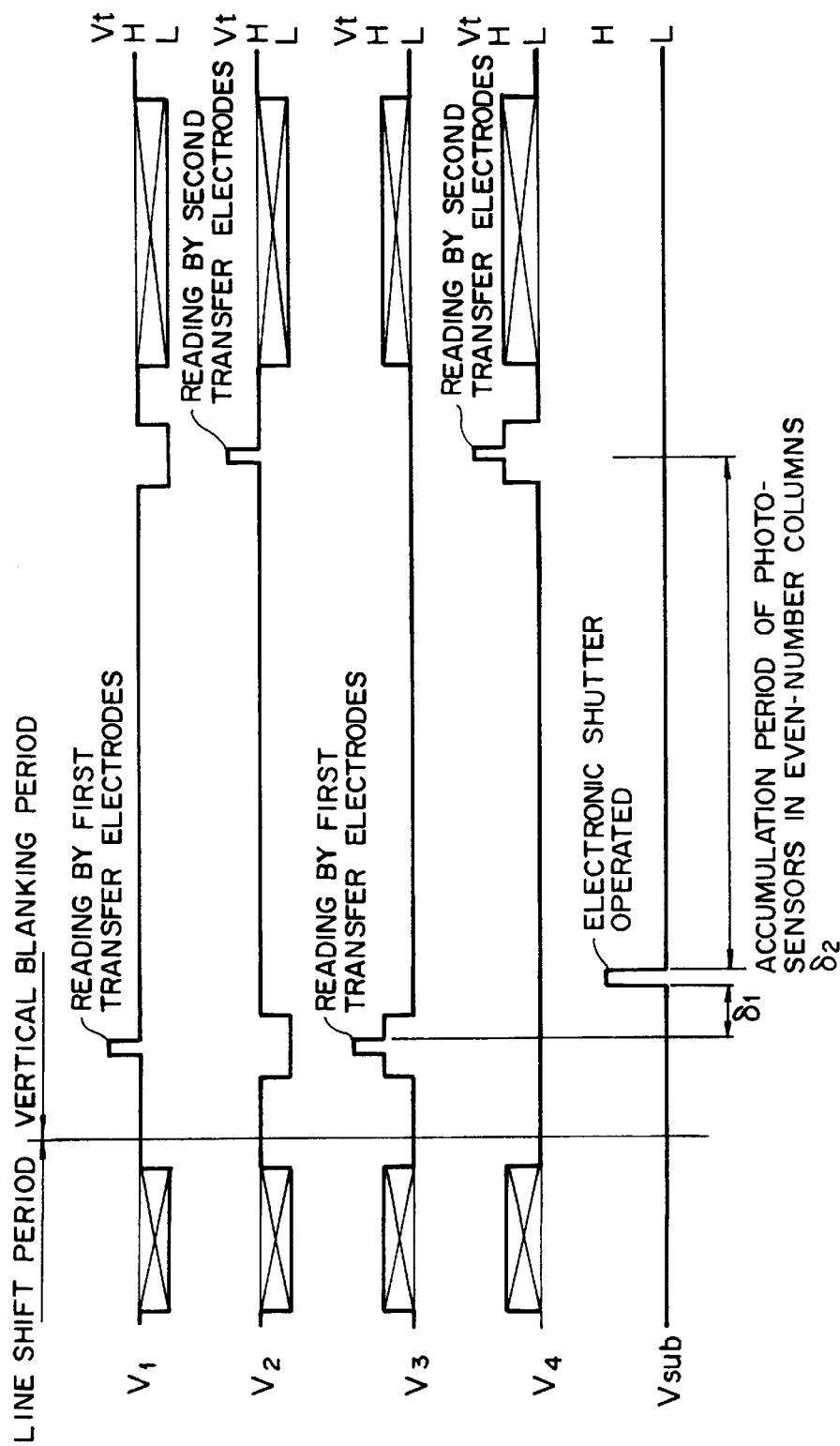

IMAGE GENERATING DEVICE HAVING ADJUSTABLE SENSITIVITY

BACKGROUND OF THE INVENTION

1. Field of the Invention

The present invention relates to a solid-state imaging apparatus and a reading method used in the imaging apparatus.

2. Description of the Related Art

A conventional method for increasing the dynamic range in a solid-state imaging apparatus is disclosed: signals accumulated in photosensors are read at different times and are separately and directly transferred to the exterior by the use of a charge-coupled device for reading all of the pixels rather than being mixed with each other in vertical registers. The signals are then added in the exterior.

Another known method for increasing the dynamic range is also disclosed: a filter is formed on photosensors so that some photosensors can possess higher sensitivity and some photosensors possess lower sensitivity. The signals are thus read from the photosensors having the adjusted sensitivity, and are then added horizontally or added in the exterior. The solid-state imaging apparatus using this method can be manufactured with a process similar to that of the solid-state imaging apparatus employing the inter-line transfer method, which is typically used. Thus, the manufacturing cost of this method is less expensive than that of the previous method. This method is also advantageous over the previous method because it can use a signal processing circuit similar to that of the inter-line transfer method.

The above-described conventional methods, however, present the following problems. The former known method requires a charge-coupled device for reading all of the pixels, thereby increasing the manufacturing cost. A line memory is also needed resulting in complicated signal processing. In the latter method, since the attenuation of transmitted light takes place by the provision of a filter, the magnification factor of the dynamic range is fixed or not variable, and also, the substantial sensitivity is lowered due to the provision of a filter.

SUMMARY OF THE INVENTION

Accordingly, it is an object of the present invention to provide a solid-state imaging apparatus which exhibits excellent performance in increasing the dynamic range without lowering the sensitivity and also to provide a reading method used in the above apparatus.

In order to achieve the above object, according to an aspect of the present invention, there is provided a solid-state imaging apparatus comprising: a plurality of photosensors disposed on the obverse surface of a semiconductor substrate in rows and columns; and accumulation-time control means for differentiating between a time for accumulating signal charges in the photosensors in the even-number columns and a time for accumulating signal charges in the photosensors in the odd-number columns.

The above imaging apparatus may further comprise addition means for adding the signal charges accumulated in the photosensors in the even-number columns and the signal charges accumulated in the photosensors in the odd-number columns. Also, the imaging apparatus may further comprise: a plurality of vertical registers each disposed along each column of the photosensors; and a read-out gate formed between the photosensors and each of the vertical registers. The vertical registers may comprise a plurality of transfer electrodes for controlling the transfer of the signal charges, and the read-out gates may comprise read-out electrodes for controlling the transfer of the signal charges from the photosensors to the vertical registers, the read-out electrodes being formed of a conductive layer different from a conductive layer forming the transfer electrodes.

According to the aforedescribed solid-state imaging apparatus, the transfer electrode of the vertical register and the read-out electrode of the read-out gate are formed of different conductive layers. It is thus possible to independently read signal charges from the photosensors in the odd-number columns and the photosensors in the even-number columns. With this arrangement, if the sensitivity of the respective photosensors are electrically adjusted by means such as actuating an electronic shutter, the signal charges read from the higher-sensitivity photosensors and those read from the lower-sensitivity photosensors can be independently added in the horizontal direction, thereby increasing the dynamic range and making its magnification factor variable.

According to another aspect of the present invention, there is provided a solid-state imaging apparatus comprising: a plurality of photosensors disposed on the obverse surface of a semiconductor substrate in rows and columns; a plurality of vertical registers each disposed along each column of the photosensors; and a read-out gate disposed corresponding to each of the photosensors and formed between the photosensor and the vertical register, having first and second read-out electrodes for controlling the transfer of signal charges from the photosensors to the vertical registers, the first read-out electrodes provided corresponding to the photosensors in every other columns and the second read-out electrodes provided corresponding to the photosensors in the remaining columns, the first and second read-out electrodes being electrically separated from each other.

According to a further aspect of the present invention, there is provided a solid-state imaging apparatus comprising: a plurality of photosensors formed in a plurality of columns in the vertical transfer direction, disposed on the obverse surface of a semiconductor substrate; a channel stop layer disposed on the semiconductor substrate and around each of the photosensors except for one side; a first transfer electrode formed via an insulating film on the semiconductor substrate at one side of each of the photosensors and downstream in the vertical transfer direction; and a second transfer electrode formed via an insulating film on the semiconductor substrate at one side of each of the photosensors and upstream in the vertical transfer direction, wherein the photosensors in the odd-number columns are each formed to extend to the semiconductor substrate adjacent to the first transfer electrode positioned at one side of the photosensor, and the channel stop layer or an offset region is provided on the semiconductor substrate adjacent to the second transfer electrode positioned at one side of the photosensor, wherein the photosensors in the even-number columns are each formed to extend to the semiconductor substrate adjacent to the second transfer electrode, and the channel stop layer or an offset region is provided on the semiconductor substrate adjacent to the first transfer electrode.

According to the above imaging apparatus, the photosensors in the odd-number columns are each formed to extend to the semiconductor substrate adjacent to the first transfer electrode at one side of the photosensor, while the channel stop layer or an offset region is provided adjacent to the second transfer electrode. Accordingly, the reading operation of the odd-number column photosensors is performed by the first transfer electrode. In contrast, the photosensors in the even-number columns are each formed to extend to the semiconductor substrate adjacent to the second transfer electrode at one side of the photosensor, while the channel stop layer or an offset region is provided adjacent to the first transfer electrode. Thus, the reading operation in the even-number column photosensors is performed by the second transfer electrode. Hence, the reading operations in the odd-number and even-number column photosensors can be independently performed by the first and second transfer electrodes, respectively. With this arrangement, if the sensitivity of the respective photosensors is electrically regulated by means such as actuating an electronic shutter, the signal charges read from the higher-sensitivity photosensors and those read from the lower-sensitivity photosensors can be independently added in the horizontal direction. It is thus possible to increase the dynamic range and to also make its magnification factor variable.

According to a further aspect of the present invention, there is provided a reading method used in a solid-state imaging apparatus which comprises a plurality of photosensors formed in each of a plurality of columns in the vertical transfer direction and a vertical register adjacent to each column of the photosensors, the method comprising the steps of: operating an electronic shutter after signal charges in the photosensors in the odd-number columns or the even-number columns are read to the vertical registers; reading the signal charges accumulated in the photosensors in the even-number columns to the vertical registers if the signal charges in the photosensors in the odd-number columns are first read, or reading the signal charges accumulated in the photosensors in the odd-number columns to the vertical registers if the signal charges in the photosensors in the even-number columns are first read; and adding the signal charges in the horizontal direction which have been read to the vertical registers.

According to the aforedescribed reading method, signal charges accumulated in either of the photosensors in the odd-number columns and the photosensors in the even-number columns are first read to the corresponding vertical registers, and signal charges in the other photosensors are then read to the associated vertical registers. Accordingly, the signal charges in the odd-number column photosensors are separately read from the charges in the even-number column photosensors. Further, an electronic shutter can be operated to make electrical adjustments of the sensitivity of the respective photosensors to desired levels. Therefore, the signal charges are read to the vertical registers from the photosensors having the adjusted levels of sensitivity and are horizontally added. As a consequence, the dynamic range can be increased and its magnification factor can be made variable.

BRIEF DESCRIPTION OF THE DRAWINGS

FIG. 6 illustrates a reading method used in the solid-state imaging apparatus according to an embodiment of the present invention; and FIG. 7 illustrates a reading method used in the solid-state imaging apparatus according to another embodiment of the present invention.

DESCRIPTION OF THE PREFERRED EMBODIMENT

Figure 1A:
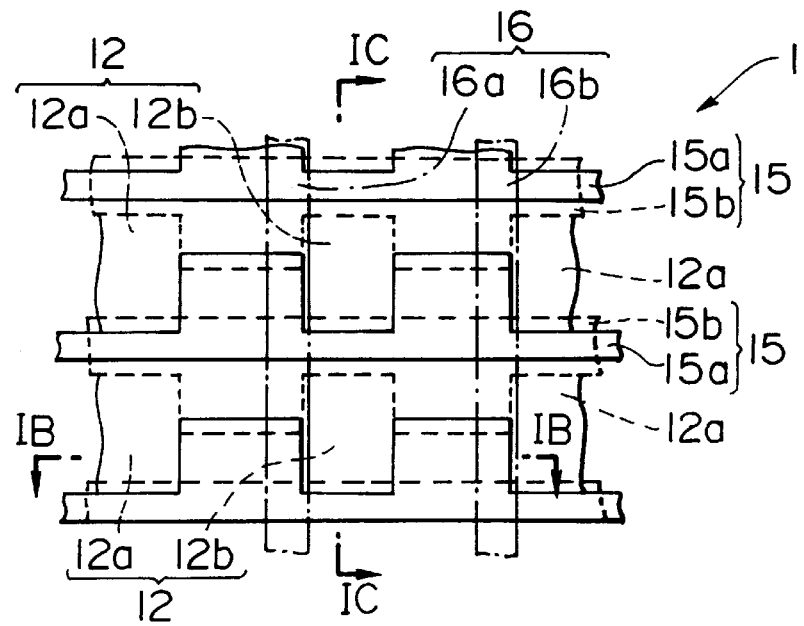
FIG. 1, which is comprised of FIGS. 1A through 1C, illustrates a solid-state imaging apparatus according to a first embodiment of the present invention.
Figure 1B:
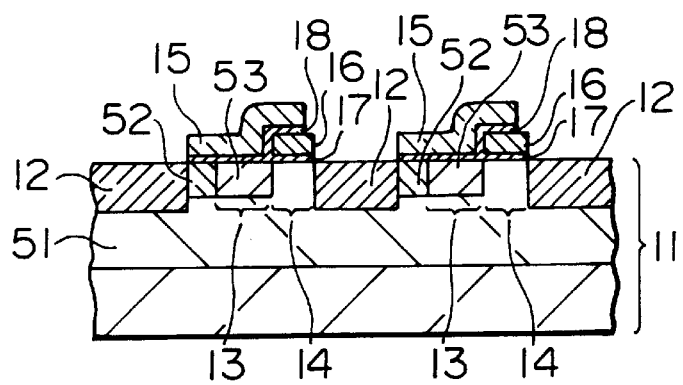
Figure 1C:
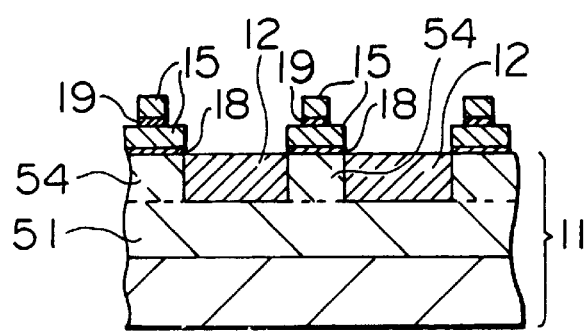

A solid-state imaging apparatus constructed in accordance with a first embodiment of the present invention will now be described with reference to FIG. 1. FIG. 1A is a plan view illustrating a layout of the first embodiment; FIG. 1B is a schematic sectional view along line I-B of FIG. 1A; and FIG. 1C is a schematic sectional view along line I-C of FIG. 1A.

A solid-state imaging apparatus generally designated by 1 has a plurality of photosensors 12 in the form of a lattice on the obverse surface of a semiconductor substrate 11. A vertical register 13 and a read-out channel 14 are sequentially disposed at one side of each photosensor 12. Transfer electrodes 15 (15a and 15b, indicated by the solid line and the broken line, respectively, in FIG. 1A) of the vertical registers 13 and read-out electrodes 16 (16a and 16b indicated by the one-dot chain lines) of the read-out channels 14 are formed of different conductive layers, for example, separate polysilicon layers. More specifically, the read-out electrodes 16 are each formed of, for example, a first polysilicon layer, on the semiconductor substrate 11 via a first insulating film 17. Further, the transfer electrodes 15a and 15b are formed of second and third polysilicon layers on the semiconductor substrate 11 via a second insulating film 18 and via a third insulating film 19, respectively. The transfer electrodes 15 are formed to partially overlap the read-out gate 16.

The above-described semiconductor substrate 11 is formed of, for example, an N-type silicon substrate, and a P-well layer 51 is deposited on the upper layer of the substrate 11. Accordingly, the aforedescribed elements for the apparatus are formed on the P-well layer 51. Further, a channel stop layer 52 and a vertical charge-coupled device 53 are disposed on the semiconductor substrate 11 below the transfer electrode 15, and a P-type layer 54 is formed between the photosensors 12 in the horizontal direction. Additionally, provided at the rear end of each transfer electrode 15 is a horizontal register (not shown) for horizontally transferring signals sent by this transfer electrode 15.

According to the solid-state imaging apparatus 1 constructed as described above, the read-out electrode 16 located on the read-out channel 14 is formed of the first polysilicon layer, while the transfer electrodes 15 on the vertical register 13 are formed of the second and third polysilicon layers. This arrangement ensures the presence of the read-out electrode 16 in each column. This further makes it possible to perform independent reading operations by the photosensors 12 (12a) in the odd-number columns (hereinafter referred to as "the odd-number column photosensors) and by the photosensors 12 (12b) in the even-number columns (hereinafter referred to as "the even-number column photosensors) by the individual read-out electrodes 16 (first read-out electrodes 16a and second read-out electrodes 16b), respectively.

Moreover, electrical adjustments of the sensitivity of the odd-number column photosensors 12 (12a) and the sensitivity of the even-number column photosensors 12 (12b) are made by means such as operating an electronic shutter. This makes it possible to set the sensitivity of the odd-number column photosensors 12 (12a) to be higher and the sensitivity of the even-number column photosensor 12 (12b) to be lower. Independent reading operations are thus performed by the respective photosensors 12 (12a and 12b).

Figure 2:
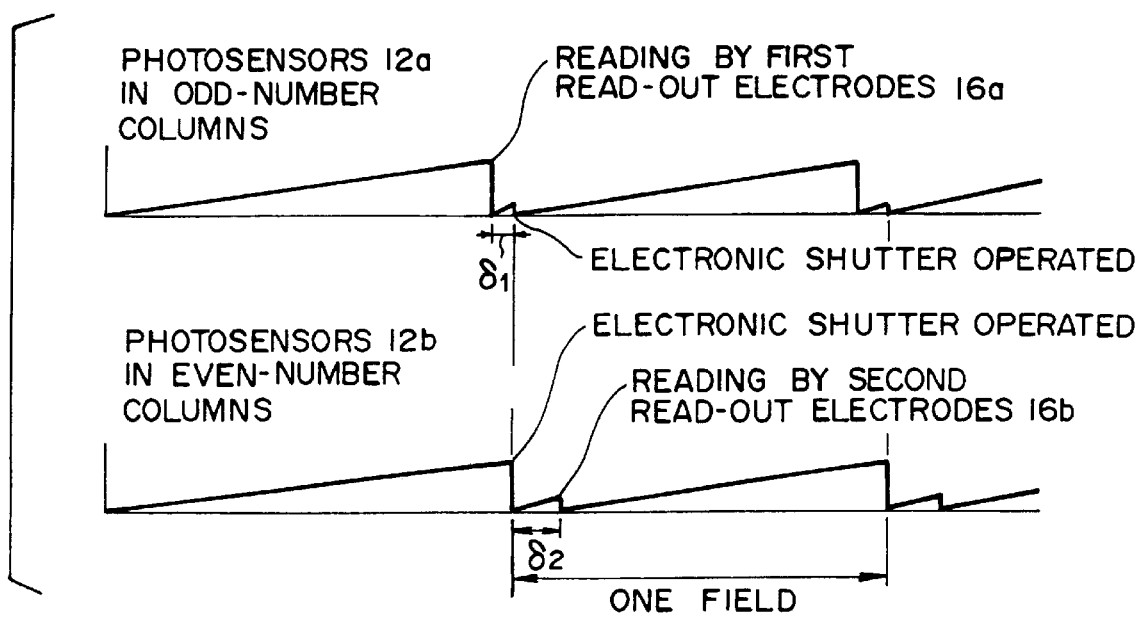
FIG. 2 illustrates the operation of the first embodiment.

An explanation will now be given of the operation of the solid-state imaging apparatus constructed in accordance with the first embodiment while referring to the timing chart of FIG. 2. In FIG. 2, the upper timing chart illustrates the operation of the odd-number column photosensors, while the lower timing chart illustrates the operation of the even-number column photosensors. For easy representation, the same elements as those shown in FIG. 1 are designated by like reference numerals.

In the solid-state imaging apparatus 1, signals are accumulated, as illustrated in FIG. 2, in each photosensor 12 during an exposure period. Then, the signals accumulated in the odd-number column photosensors 12a are read by the first read-out electrodes 16a. After a lapse of a predetermined period $\delta_1$, the electronic shutter is actuated to remove the charges accumulated in the photosensors 12a and 12b. As the electronic shutter, a known vertical-type or horizontal-type overflow drain may be used. Further, after a lapse of a predetermined period $\delta_2$, the signals accumulated in the even-number column photosensors 12b are read by the second read-out electrodes 16b. Thereafter, the signals are transferred to a charge-voltage transducer (not shown) or to a horizontal register (not shown) via the corresponding vertical registers and are horizontally added therein or in the exterior. The signals may be added according to a method disclosed in Japanese Patent Application No. 7-266587 or 8-87387.

As discussed above, an electronic shutter can be actuated to provide a reading timing so as to adjust the sensitivity of the photosensors 12 (12a and 12b). This makes it possible to set the sensitivity of the photosensors 12, for example, in the following manner. The odd-number column photosensors 12a is determined to be higher, while the sensitivity of the even-number column photosensors 12b to be lower than that of the photosensors 12a. Naturally, the reverse is possible. It is thus possible to suitably adjust the sensitivity of the respective photosensors 12, thereby increasing the dynamic range and also making its magnification factor variable.

According to the above description, in the solid-state imaging apparatus 1, signal processing can be simplified, and also, the manufacturing cost can be reduced because this apparatus 1 is constructed in a manner similar to the interline transfer solid-state imaging apparatuses, except that the read-out electrodes 16 are independently disposed. Further, the apparatus 1 is not constructed to change its sensitivity by forming a filter on the photosensors 12, thereby substantially maintaining the sensitivity of the photosensors at a constant level.

Figure 3A:
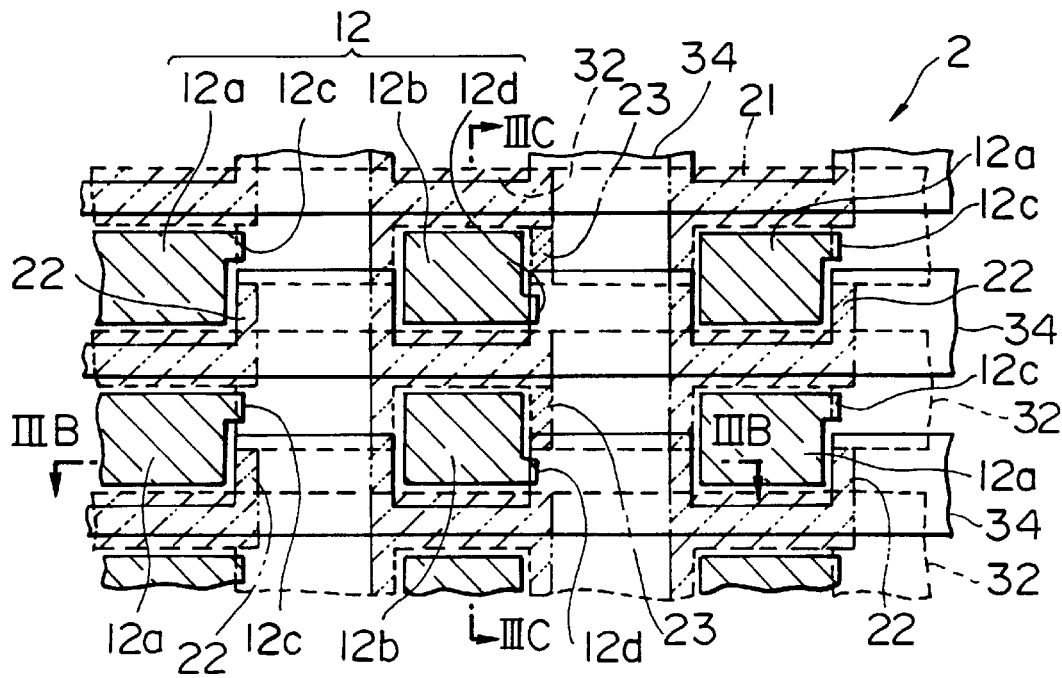
FIG. 3, which is comprised of FIGS. 3A through 3C, illustrates a solid-state imaging apparatus according to a second embodiment of the present invention.
Figure 3B:
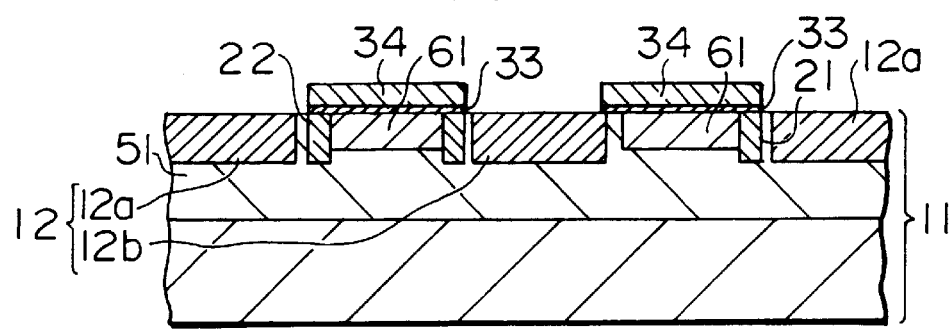
Figure 3C:
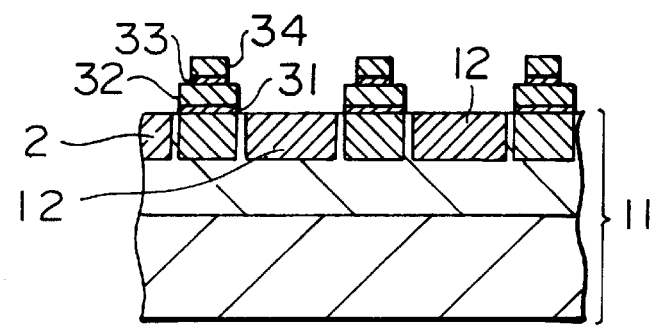

A description will now be given of a solid-state imaging apparatus according to a second embodiment of the present invention while referring to FIG. 3. FIG. 3A is a plan view illustrating a layout of the solid-state imaging apparatus; FIG. 3B is a schematic sectional view along line III-B of FIG. 3A; and FIG. 3C is a schematic sectional view along line III-C of FIG. 3A.

A solid-state imaging apparatus generally indicated by 2 of this embodiment has a plurality of photosensors 12 (indicated by the solid hatched portion in FIG. 3A) in a plurality of columns on the obverse surface of a semiconductor substrate 11. A channel stop layer 21 (indicated by the two-dot chain hatched portion) is provided on the semiconductor substrate 11 around each photosensor 12 except for one side. Further, a first transfer electrode 32 (indicated by the broken line in FIG. 3A) is formed via a first insulating film 31 on the semiconductor substrate 11 at one side of each photosensor 12 and adjacent to the rear end in the vertical transfer direction. Also, a second transfer electrode 34 (designated by the solid line in FIG. 3A) is formed via a second insulating film 33 on the semiconductor substrate 11 at one side of each photosensor 12 and adjacent to the front end in the vertical transfer direction.

Among the photosensors 12, the odd-number column photosensors 12a are each disposed to extend at one side to the semiconductor substrate 11 adjacent to the first transfer electrode 32, and such an extended portion is indicated by 12c in FIG. 3A. Additionally, a channel stop layer 22 is provided on the semiconductor substrate 11 adjacent to the second transfer electrode 34. In contrast, the even-number column photosensors 12b are each formed to extend at one side to the semiconductor substrate 11 adjacent to the second transfer electrode 34, and such an extended portion is designated by 12d in FIG. 3A. Also, a channel stop layer 23 is provided on the semiconductor substrate 11 close to the first transfer electrode 32 at one side of the photosensor 12b.

The semiconductor substrate 11 is formed of, for example, N-type silicon, and a P-well layer 51 is deposited on the upper layer of the substrate 11. Accordingly, the above-described elements for the apparatus 2 are formed on the P-well layer 51. Moreover, vertical registers 61 are formed on the semiconductor substrate 11 under the first and second transfer electrodes 32 and 34. Further, provided at the rear ends of the first and second transfer electrodes 32 and 34 is a horizontal register (not shown) for horizontally transferring the signals sent by the transfer electrodes 32 and 34.

In the solid-state imaging apparatus 2 constructed as described above, the odd-number column photosensors 12a are each extended to the first transfer electrode 32, and the channel stop layer 22 is provided at one side of the photosensor 12a adjacent to the second transfer electrode 34. Thus, the signals accumulated in the odd-number column photosensor 12a can be read to the first transfer electrode 32. In contrast, the even-number column photosensors 12b are each extended to the second transfer electrode 34, and the channel stop layer 23 is disposed at one side of the photosensor 12b close to the first transfer electrode 32. This makes it possible to read the signals accumulated in the even-number column photosensor 12b to the second transfer electrode 34. Subsequently, the signals are transferred to a charge-voltage transducer (unillustrated) or to a horizontal register (not shown) via the corresponding vertical registers and are horizontally added therein or in the exterior.

Figure 4:
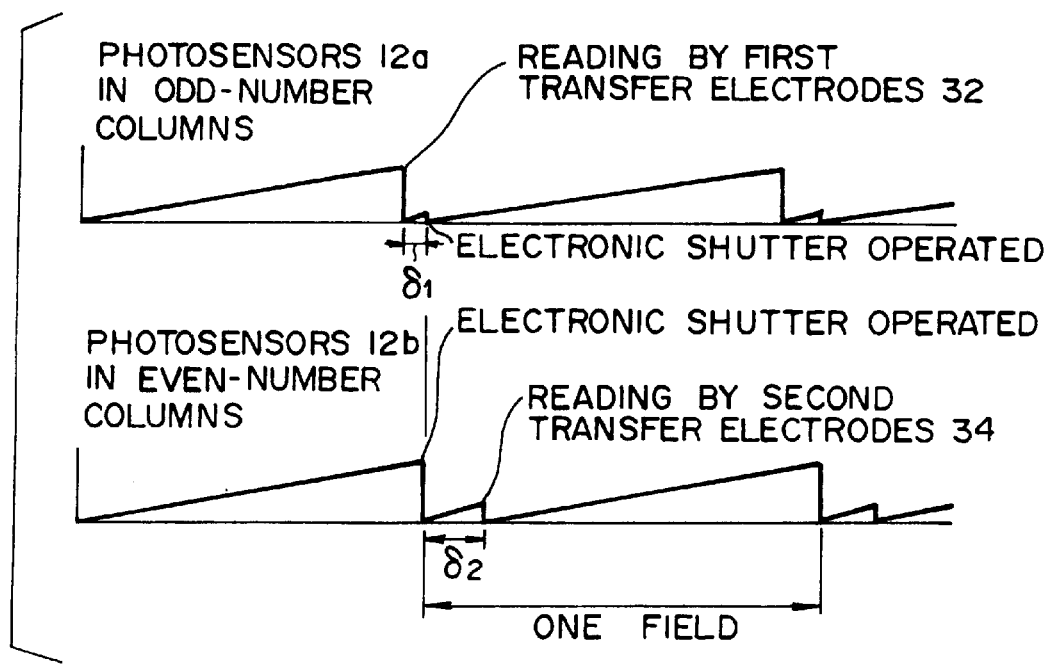
FIG. 4 illustrates the operation of the second embodiment.

The operation of the solid-state imaging apparatus 2 according to the second embodiment will now be explained with reference to the timing chart of FIG. 4. In FIG. 4, the upper timing chart illustrates the operation of the odd-number column photosensors, while the lower timing chart illustrates the operation of the even-number column photosensors. For better representation, the same elements as those shown in FIG. 3 are designated by like reference numerals.

In the solid-state imaging apparatus 2, signals are accumulated in each photosensors 12 during an exposure period. The signals accumulated in the photosensors 12a are read by the first transfer electrodes 32. After a lapse of a predetermined period $\delta_1$, the electronic shutter is operated. Then, after a lapse of a predetermined period 82, the signals accumulated in the photosensors 12b are read by the second transfer electrodes 34. Thereafter, the read signals are transferred to a charge-voltage transducer (unillustrated) or to a horizontal register (not shown) via the associated vertical registers (formed of, such as the first and second transfer electrodes 32 and 34) and are horizontally added therein or in the exterior.

An electronic shutter can be actuated to regulate the reading timing so as to adjust the sensitivity of the photosensors 12 (12a and 12b). It is thus possible to set the sensitivity of the photosensors 12, for example, in the following manner. The sensitivity of the odd-number column photosensors 12a are determined to be higher, while the sensitivity of the even-number column photosensors 12b to be lower than that of the photosensors 12a. Naturally, the reverse is possible. This makes it possible to make appropriate adjustments of the sensitivity of the photosensors 12, thereby increasing the dynamic range and also making its magnification factor variable.

According to the foregoing description, in the solid-state imaging apparatus 2, signal processing can be simplified, and also, the manufacturing cost can be reduced because the apparatus 2 is constructed in a manner similar to the interline transfer solid-state imaging apparatuses, except for the provision of the extended portions of the photosensors 12 and the provision of the channel stop layers 22 and 23. Additionally, the apparatus 2 is not constructed to change its sensitivity by forming a filter on the photosensors 12, thereby substantially maintaining the sensitivity at a constant level.

Figure 5:
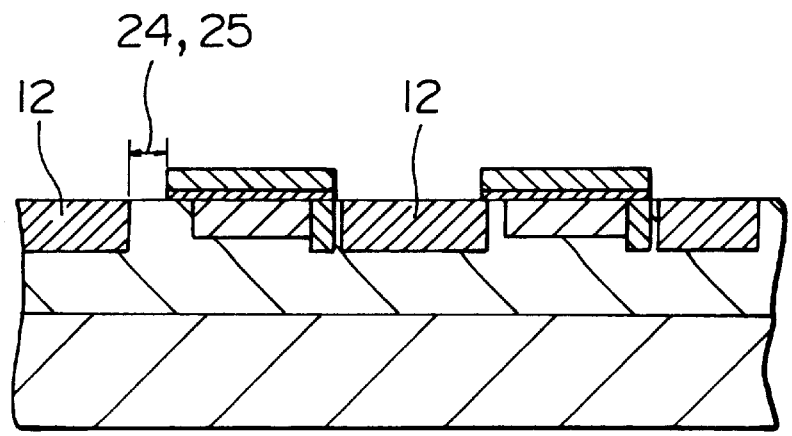
FIG. 5 illustrates an example of modifications of the second embodiment.

This apparatus 2 may be modified in the following manner. In place of forming the channel stop layer 22, an offset region 24 may be provided, as illustrated in FIG. 5, at one side of the photosensor 12a on the semiconductor substrate 11 adjacent to the second transfer electrode 34. Similarly, an offset region (25) may be provided at one side of the photosensor 12b on the semiconductor substrate 11 adjacent to the first transfer electrode 32, though it is not shown. This modification may offer advantages similar to those achieved by the solid-state imaging apparatus 2 provided with the channel stop layers 22 and 23.

As noted above, since the solid-state imaging apparatuses 1 and 2 are substantially similar to the inter-line transfer solid-state imaging apparatuses in their signal processing circuit, the signal processing circuit of the former apparatus 1 or 2 can be substituted with that the latter apparatus. Also, the apparatuses 1 and 2 can be used as inter-line transfer apparatuses, thereby enabling the efficient use of incident light. Also, the manufacturing process of the imaging apparatuses 1 and 2 is similar to that of the inter-line imaging apparatuses by virtue of their similar construction, thereby achieving the decreased manufacturing cost.

A reading method employed in a solid-state imaging apparatus according to an embodiment the present invention will now be described with reference to FIG. 6.

FIG. 6 illustrates the relationship between the potential and the timing: the vertical axis indicates the potential; and the horizontal axis represents the reading timing. $V_1$, $V_2$, $V_3$ and $V_4$ depict transfer electrodes. The imaging apparatus for reading signals in this method is, for example, the aforedescribed solid-state imaging apparatus 1 shown in FIG. 1, which is a four-phase driven type.

The reading method comprises the following steps, as illustrated in FIG. 6. (1) Signals are accumulated in the odd-number column photosensors and the even-number column photosensors during an exposure period. (2) Only, for example, the signals accumulated in the odd-number column photosensors are read out to the corresponding vertical registers by the first read-out electrodes. This empties the odd-number column photosensors, and the signals continue to be accumulated in the even-number column photosensors. (3) After a lapse of a predetermined duration $\delta_1$ upon the signal-reading from the odd-number column photosensors, the electronic shutter is actuated to drain the signals accumulated in the odd-number column photosensors and the even-number column photosensors to the substrate (Sub). Thus, the photosensors are completely emptied, and the signals remain only in the vertical registers. (4) After a lapse of a predetermined period $\delta_2$ upon the actuation of the electronic shutter, only the signals in the even-number column photosensors are read out to the vertical registers. Thus, the even-number column photosensors are emptied, and the signals continue to be accumulated in the odd-number column photosensors. In this manner, the reading operation is performed according to the above process steps (1) through (4) so as to alternately accumulate saturation signals and low-level signals in the vertical registers. The accumulated signals are then transferred to a charge-voltage transducer or to a horizontal register and are horizontally added therein.

According to the above embodiment of the reading method used in the solid-state imaging apparatus, the signals in the odd-number column photosensors are read by the first read-out electrodes, while the signals in the even-number column photosensors are read by the second read-out electrodes. Thus, the signals in the respective photosensors are separately read out to the vertical registers. Moreover, according to the timing of operating the electronic shutter, the sensitivity of the respective photosensors can be electrically adjusted to desired levels. Namely, the timing of the electronic shutter can be provided to determine the level of signals to be read to the vertical registers from the photosensors. The signals are then transferred to the vertical registers from the photosensors having the adjusted levels of sensitivity and are further horizontally added, thereby increasing the dynamic range and also making its magnification factor variable, up to 10,000 levels of gradation, which is equivalent to one hundred times as high as the magnification factor of the dynamic range of signals read by a conventional reading method.

An explanation will be further given of the reading method according to another embodiment of the present invention with reference to FIG. 7. FIG. 7 illustrates the relationship between the potential and the timing: the vertical axis represents the potential; and the horizontal axis depicts the timing. A solid-state imaging apparatus for reading signals in this method is, for example, the aforedescribed solid-state imaging apparatus 2 shown in FIG. 3, which is a four-phase driven type.

The reading method of this embodiment comprises the following steps, as illustrated in FIG. 7. (1) Signals are accumulated in the odd-number column photosensors and the even-number column photosensors during an exposure period. (2) A voltage Vt is applied to the first transfer electrodes $V_1$ and $V_3$ to read only the signals, for example, in the odd-number column photosensors, to the vertical registers. This empties the odd-number column photosensors, and signals continue to be accumulated in the even-number column photosensors. (3) After a lapse of a predetermined period $\delta_1$ upon reading the signals from the odd-number column photosensors, the electronic shutter is actuated to drain the signals to the substrate (Sub) from the respective photosensors. This totally eliminates the signals in the respective photosensors, and the signals remain only in the vertical registers. (4) After a lapse of a predetermined duration $\delta_2$ upon the actuation of the electronic shutter, a voltage Vt is applied to the second transfer electrodes $V_2$ and $V_4$ to read only the signals in the even-number column photosensors to the vertical registers. This empties the even-number column photosensors, and signals continue to be accumulated in the odd-number column photosensors. In this fashion, the reading operation is performed according to the above process steps (1) through (4) so as to alternately accumulate saturation signals and low-level signals in the vertical registers. These signals are then horizontally added by a charge-voltage transducer or a horizontal register.

According to this embodiment of the reading method, signals are read from the odd-number column photosensors by the first transfer electrodes, while signals are read from the even-number column photosensors by the second transfer electrodes. Accordingly, the signals are separately read from the respective photosensors to the vertical registers. In a manner similar to the previous embodiment, the timing of operating the electronic shutter can be provided to electrically regulate the sensitivity of the respective photosensors to desired levels. Then, the signals are read out to the vertical registers from the photosensors having the adjusted levels of sensitivity and are horizontally added. This can increase the dynamic range and also make its magnification factor variable, up to 10,000 levels of gradation, which is equivalent to one hundred times as high as the magnification factor of the dynamic range of signals read by a known reading method.

It should be noted that the inter-line reading method is also feasible by rendering the electronic shutter inoperable in the above reading methods.

As will be clearly understood from the foregoing description, the present invention offers the following advantages.

According to one form of the solid-state imaging apparatus of the present invention, since the transfer electrodes and the read-out electrodes are formed of different conductive layers, the reading operations from the odd-number column photosensors and the even-number column photosensors by the respective read-out electrodes can be independently performed. With this arrangement, if the sensitivity of the respective photosensors is adjusted by means such as operating an electronic shutter, the signals read from the higher-sensitivity photosensors and the signals read from the lower-sensitivity photosensors are independently added in the horizontal direction. As a result, the magnification factor of the dynamic range can be made variable. Additionally, the absence of a filter can substantially maintain the sensitivity of the photosensors at a constant level.

According to another form of the solid-state imaging apparatus of the present invention, the odd-number column photosensors are each extended to the first transfer electrode, while a channel stop layer or an offset region is provided adjacent to the second transfer electrode. Accordingly, the signals in the odd-number column photosensors can be read by the first transfer electrodes. In contrast, the even-number column photosensors are each extended to the second transfer electrode, while a channel stop layer or an offset region is provided adjacent to the first transfer electrode. Thus, the signals in the even-number column photosensors can be read by the second transfer electrodes. In this manner, the reading operations from the odd-number column photosensors and the even-number column photosensors can be independently performed by the respective transfer electrodes. As a consequence, in this form of the invention, as well as in the previous form of the invention, the dynamic range can be increased. Moreover, the timing of operating the electronic shutter can be provided to electrically regulate the sensitivity of the respective photosensors, thereby making the magnification factor of the dynamic range variable.

According to the reading method employed in the solid-state imaging apparatus, signals in either of the odd-number column photosensors or the even-number column photosensors are first read to the corresponding vertical registers, and then, signals in the other photosensors are read to the associated vertical registers, so that the signals in the odd-number and even-number column photosensors can be separately read to the vertical registers. Further, the electronic shutter is actuated to set desired levels of signals to be read, thereby determining the sensitivity of the odd-number column photosensors and the sensitivity of the even-number column photosensors to desired levels. The signals are then read to the vertical registers from the photosensors having the adjusted levels of sensitivity and are further horizontally added. According to this method, the magnification factor of the dynamic range can be increased. Additionally, the absence of a filter can keep the sensitivity of the photosensors at a substantially constant level.

What is claimed is:

1. A solid-state imaging apparatus comprising:

a plurality of photosensors arranged in rows and columns;

accumulation-time control means for controlling accumulation of signal charges in said photosensors and differentiating between a first time period for accumulating signal charges in the photosensors in a first group and a chronologically different second time period for accumulating signal charges in the photosensors in a second group, and for interposing a shutter operation between separate readouts of said signal charges from the photosensors of the first group and of the second group;

means for separately transferring the signal charges from the first group and the second group via a single vertical transfer register; and means for combining respective signal charges from photosensors of the first and second groups following said transfer via a vertical transfer register to form image information, wherein the photosensors of the first group and the photosensors of the second group are different, wherein the shutter operation removes accumulated signal charges in the photosensors of the first group and in the photosensors of the second group to a drain, and wherein a further readout operation is not interposed between the separate readouts of said signal charges from the photosensors of the first group and the photosensors of the second group.

2. A solid-state imaging apparatus according to claim 1, further comprising:

a plurality of vertical registers each disposed along each column of said photosensors; and a read-out gate formed between said photosensors and each of said vertical registers.

3. A solid-state imaging apparatus according to claim 2, wherein said vertical registers comprise a plurality of transfer electrodes for controlling the transfer of the signal charges, and said read-out gates comprise read-out electrodes for controlling the transfer of the signal charges from said photosensors to said vertical registers, said read-out electrodes being formed of a conductive layer different from a conductive layer forming said transfer electrodes.

4. A solid-state imaging apparatus according to claim 2, wherein said vertical registers each comprise a first transfer electrode located at one side of said photosensor and adjacent to a rear end in the vertical transfer direction, and a second transfer electrode located at one side of said photosensor and adjacent to a front end in the vertical transfer direction, and wherein the read-out gates provided corresponding to the photosensors in even-number columns are controlled by one of said first and second transfer electrodes, and the read-out gates provided corresponding to the photosensors in odd-number columns are controlled by the other one of said first and second transfer electrodes.

5. A solid-state imaging apparatus comprising:
a plurality of photosensors arranged in rows and columns;
a plurality of vertical registers formed adjacent respective columns of the photosensors; and
a read-out gate corresponding to each of said photosensors and formed between said photosensors and its respective vertical register, said read-out gates having first and second read-out electrodes for controlling the transfer of signal charges from said photosensors to said vertical registers, said first read-out electrodes provided corresponding to photosensors in a first group of said photosensors and said second read-out electrodes provided corresponding to the photosensors in a second group of said photosensors, said first and second read-out electrodes being electrically separated from each other;
wherein,
the photosensors of the first group and the photosensors of the second group are different,
signal charges from the first group are added to corresponding signal charges from the second group to form image information,
the time period for accumulating signal charges in the photosensors of the first group is chronologically different than the time period for accumulating signal charges in the photosensors of the second group,
a shutter operation is effected between readout of the signal charges from the first group and a readout operation of the signal charges from the second group,
the shutter operation removes accumulated signal charges in the photosensors of the first group and in the photosensors of the second group to a drain,
a further readout operation is not interposed between the readout of the signal charges from the photosensors of the first group and the readout operation of the signal charges from the photosensors of the second group, and
the charges from the first group and the second group are separately transferred in a single vertical transfer register.

6. A method of generating image information comprising the steps of:
providing a plurality of photosensors arranged in columns;
providing a plurality of vertical registers, each of which is disposed along a respective one of a plurality of the columns of photosensors; and
applying a signal to a first read-out electrode of a read-out gate to read signal charges from a first group of said photosensors into a respective vertical register;
thereafter effecting an electronic shutter operation;
thereafter applying a signal to a second read-out electrode of the read-out gate to read signal charges from a second group of said photosensors into a respective vertical register, wherein the second group of said photosensors and the first group of said photosensors are different, wherein the shutter operation removes accumulated signal charges in the first group of said photosensors and in the second group of said photosensors to a drain, and wherein a further read-out operation is not interposed between the read-out of the signal charges from the first group of said photosensors and the read-out of the signal charges from the second group of said photosensors;
transferring the signal charges through the vertical transfer registers; and
adding the signal charges from photosensors of the first group with corresponding signal charges from the photosensors of the second group to form image information, a time period for accumulating signal charges in the photosensors of the first group being chronologically different than a time period for accumulating signal charges in the photosensors of the second group, the charges from the first group and the second group are separately transferred in a vertical transfer register.

7. A method of generating image information according to claim 6 comprising an additional step of operating an electronic shutter to eliminate signal charges in said photosensors of said first column after the read-out pulse is applied to said first read-out electrode, and thereafter the read-out pulse is applied to said second read-out.

8. A solid-state imaging apparatus comprising:
a plurality of photosensors formed in a plurality of columns in the vertical transfer direction on a semiconductor substrate;
a channel stop layer disposed on said semiconductor substrate and around each of said photosensors except for one side;
a first transfer electrode formed at one side of each of said photosensors and adjacent to a rear end in the vertical transfer direction; and
a second transfer electrode formed at one side of each of said photosensors and adjacent to a front end in the vertical transfer direction,
wherein the photosensors in a first group are each formed to extend to said semiconductor substrate adjacent to said first transfer electrode and said channel stop layer or an offset region is provided on said semiconductor substrate adjacent to said second transfer electrode,
wherein the photosensors in a second group are each formed to extend to said semiconductor substrate adjacent to said second transfer electrode, and said channel stop layer or an offset region is provided on said semiconductor substrate adjacent to said first transfer electrode,
wherein the photosensors in the second group and the photosensors in the first group are different,
wherein the time for accumulating signal charges in the photosensors of the first group is chronologically different than the time for accumulating signal charges in the photosensors of the second group,
wherein the charges from the first group and the second group are separately transferred in a single vertical transfer register,
wherein a shutter operation is effected between a read-out of the signal charges of the photosensors in the first group and a subsequent readout of the signal charges of the photosensors in the second group,
wherein the shutter operation removes accumulated signal charges in the photosensors of the first group and in the photosensors of the second group to a drain, and wherein a further readout is not interposed between the readout of the signal charges from the photosensors of the first group and the readout operation of the signal charges from the photosensors of the second group.

9. A method of generating image information comprising the steps of:

generating first signal charges in a first plurality of photosensors and generating second signal charges in a second plurality of photosensors, wherein a time period in which the first signal charges are generated is chronologically different than a time period in which the second signal charges are generated, and wherein the second plurality of photosensors and the first plurality of photosensors are different;

reading out the first signal charges at a first point in time and reading out the second signal charges at a second point in time;

effecting a shutter operation between the first point in time and the second point in time, wherein the shutter operation removes accumulated signal charges in the first plurality of photosensors and in the second plurality of photosensors to a drain, and wherein a further readout operation is not interposed between the readout of the signal charges from the first plurality of photosensors and the readout operation of the signal charges from the second plurality of photosensors;

transferring the first signal charges through a vertical transfer register in a first period of time;

transferring the second signal charges through the vertical transfer register during a second period of time; and thereafter combining the first signal charges with corresponding ones of the second signal charges.

10. A reading method according to claim 9, further comprising a step of selecting a time of operating said electronic shutter to adjust the levels of sensitivity of said photosensors.

11. The method of generating image information of claim 9, further comprising a step of operating an electronic shutter on said first plurality of columns after reading signal charges from said first plurality of columns.

12. A method of generating image information comprising the steps of:

reading out a first group of signal charges from a first group of photosensors generated during a first time period;

thereafter effecting a shutter operation;

thereafter reading out a second group of signal charges generated in a second group of photosensors during a second time period which is chronologically different than the first time period;

separately transferring the first and second signal charges via respective vertical registers; and thereafter combining first and second signal charges,
wherein the first group of photosensors and the second group of photosensors are different,
wherein the shutter operation removes accumulated signal charges in the first group of photosensors and in the second group of photosensors to a drain, and
wherein a further reading out is not interposed between the reading out of the first group of signal charges generated in the first group of photosensors and the reading out of the second group of signal charges generated in a second group of photosensors.

* * * * *